United States Patent [19]

Magarino et al.

[11] E Patent Number: Re. 33,321

[45] Reissued Date of Patent: Sep. 4, 1990

[54] PROCESS FOR THE PRODUCTION OF A SUBSTRATE FOR AN ELECTRICALLY CONTROLLED DEVICE AND DISPLAY SCREEN PRODUCED FROM SUCH A SUBSTRATE

[76] Inventors: Jose Magarino, 9 rue Bagon Aripoli, 923350 Plessis Robinson; Nicholas Szydlo, 6, allee des Arpents, 91470 Limours; Michel Hareng, 17, Chemin De La Garenne, 91290 La Nourville; Pierre Landouar, 92 Av. Du General Leclerc, 91120 Palaiseau, all of France

[21] Appl. No.: 311,710

[22] Filed: Feb. 16, 1989

Related U.S. Patent Documents

Reissue of:

[64] Patent No.: 4,643,527
Issued: Feb. 17, 1987
Appl. No.: 642,527
Filed: Aug. 20, 1984

[30] Foreign Application Priority Data

Aug. 26, 1983 [FR] France ..... 83 13788

[51] Int. Cl.[5] ..... G02F 1/13; H01L 21/205

[52] U.S. Cl. ..... 350/333; 350/334; 437/3; 437/101; 437/233; 437/247

[58] Field of Search ..... 350/333, 334; 357/2, 357/15, 23.7, 32; 437/3, 101, 233, 247; 427/108; 423/349

[56] References Cited

U.S. PATENT DOCUMENTS 4,459,163 7/1984 MacDiarmid ..... 437/2
4,581,620 4/1986 Yamazaki et al. ..... 357/2

FOREIGN PATENT DOCUMENTS 2374714 7/1978 France .
2518788 6/1983 France .

OTHER PUBLICATIONS

Revue de Physique Appliquee, vol. 17, No. 12, decembre 1982, Orsay (FR), D. Bensahel et al.: "A Comparison Between Furnace and CW Laser. . .".

Journal of Applied Physics, vol. 54, No. 5, mai 1983, New York (US), Y. Kunii et al.: "Solid-Phase Lateral Epitaxy of Chemical-Vapor. . .".

Applied Physics Letters, vol. 40, No. 11, juin 1983, New York (US), N. Szydlo et al.: "High Current Post-Hydrogenated Chemical Vapor. . .".

Eai-Electronique et Applications Industrielles; No. 254, ler juin 1978, Paris (FR), F. Morin: "Des Transistors en Couches Minces Pour. . .".

*Primary Examiner*—Andrew J. James
*Assistant Examiner*—Napoleon Thantu
*Attorney, Agent, or Firm*—Roland Plottel

[57] ABSTRACT

The invention relates to a process for the production of a substrate for an electrically controlled device such as a display screen, said substrate integrating non-linear elements and control elements of the elementary display points. The invention relates to the production of a substrate, in its active part, has non-linear elements associated with each image element and produced from amorphous silicon and, in its peripheral part, polycrystalline silicon controlled elements. Initially the substrate has amorphous silicon layers, the peripheral crystallization being obtained by annealing in a temperature gradient furnace.

8 Claims, 6 Drawing Sheets

FIG. 7
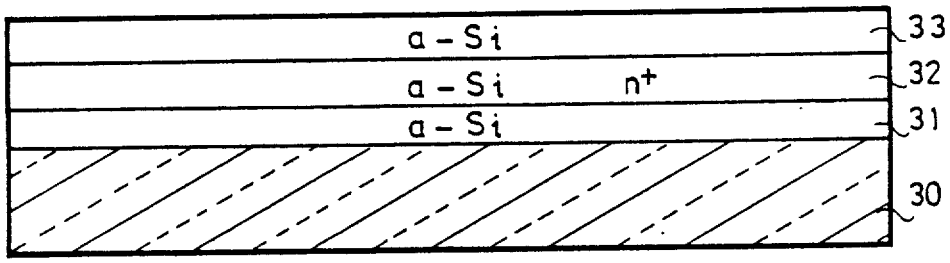
FIG. 8
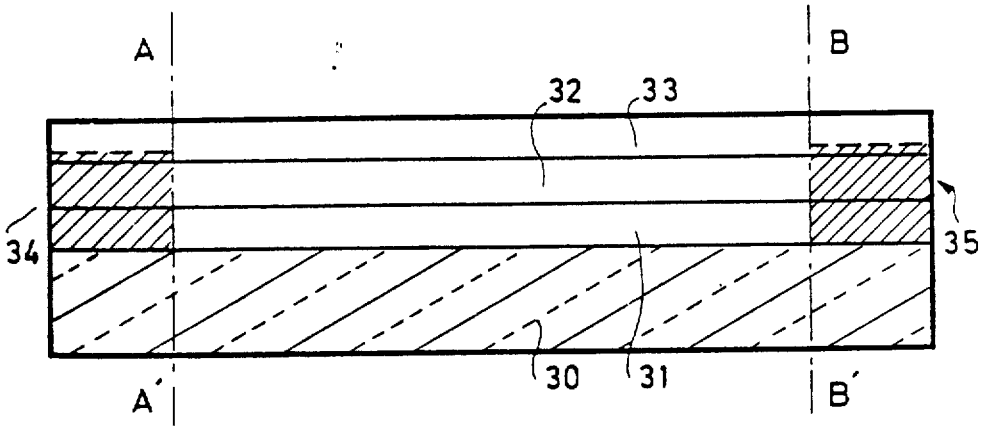
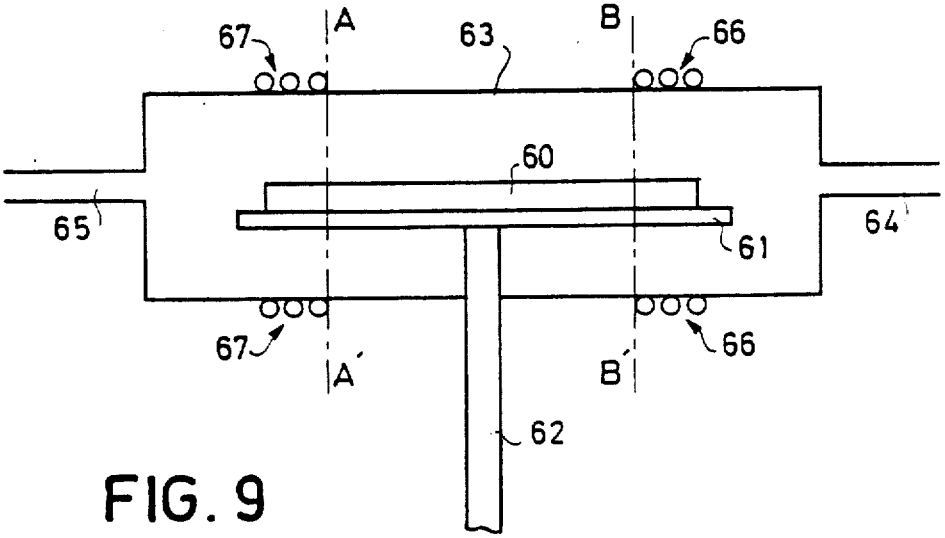
FIG. 9

PROCESS FOR THE PRODUCTION OF A SUBSTRATE FOR AN ELECTRICALLY CONTROLLED DEVICE AND DISPLAY SCREEN PRODUCED FROM SUCH A SUBSTRATE

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a process for the production of a substrate incorporating semiconductor devices and in particular those permitting a double control system of a flat liquid crystal screen in which the addressing of each elementary point is realized by non-linear amorphous silicon elements and the control of the rows and columns is provided by thin polycrystalline silicon film transistors integrated on to the same substrate around the active part of the screen. At least two types of device are used on the same basic material, namely amorphous silicon obtained by the thermal decomposition of silane. The selective crystallization on the periphery of the active part is carried out by annealing in a furnace having a temperature gradient.

2. Description of the Prior Art

The addressing of matrix access display screens can be carried out in different ways. This addressing can be carried out by transistors deposited in thin film form on e.g. a glass substrate, each transistor being associated in series with an electrooptical material image element. These transistors are preferably produced from amorphous silicon permitting a better homogeneity of the characteristics on large surfaces. The disadvantage of this addressing is due to the difficulty of finely controlling the properties of the different films constituting the thin film transistors. Thus, these transistors are formed from several films of materials such as amorphous silicon, insulants, etc. and it is difficult to obtain good insulants and good interfaces between the different films by low temperature processes. These production difficulties increase with the number of transistors to be implanted and particularly when the number of transistors is equal to the number of image elements of the screen.

Thin amorphous silicon film transistors are also not satisfactory for the integrated control of row and column electrodes, due to their low admissible direct current, which imposes matrix control by circuits outside the screen.

An integration of this control on the basis of thin film transistors produced on polycrystalline layers obtained by laser annealing of amorphous silicon has been the subject of tests. On the basis of this method, it is possible to obtain a display screen, whose image elements are controlled by amorphous silicon transistors and the rows and columns by polycrystalline silicon transistors. However, although the transistors obtained by laser annealing have very good performance characteristics, it is difficult to produce them in large numbers with a good reproducibility. It is therefore necessary for the thermal method used to provide an excellent crystallization uniformity. It is also known to control the image elements by non-linear elements of the varistor type.

SUMMARY OF THE INVENTION

In order to obviate these disadvantages, the invention proposes a substrate permitting the production of a screen, whose double control function is entirely integrated into said substrate, on the basis of an amorphous silicon material obtained by the thermal decomposition of silane. On the basis of this material, non-linear elements or amorphous silicon transistors are produced in series with the image elements and thin film transistors are produced on the periphery of the screen on the polycrystalline silicon obtained by annealing the amorphous silicon in a temperature gradient furnace.

The invention therefore relates to a process for the production of a substrate for an electrically controlled device, said substrate being formed from a support which supports active amorphous silicon elements and active polycrystalline silicon elements, from the same basic material constituted by amorphous silicon, wherein the process involves the crystallization of predetermined areas of the basic material carried out in a furnace, whose temperature gradient has an abrupt profile permitting the rapid passage of said crystallized areas to the remainder of the basic material maintained in the amorphous state.

The invention also relates to a matrix access display screen incorporating an electro-optical material layer inserted between a transparent layer and a substrate incorporating active elements associated with the image elements of the screen and active elements for the control of the row and column connections of the display screen, the substrate being obtained according to the production process described hereinbefore.

BRIEF DESCRIPTION OF THE DRAWINGS

The invention is described in greater detail hereinafter relative to a non-limitative embodiment and the attached drawings, wherein show:

FIGS. 7 and 8 views of a substrate incorporating silicon layers.

FIG. 9 a temperature gradient furnace.

DESCRIPTION OF THE PREFERRED EMBODIMENT

The matrix access display screens are constituted by an electrooptical material, such as a liquid crystal layer, between two sets of crossed electrodes representing the rows and columns of the display screen. The intersection of a row and a column defines an image element or point of the screen.

Figure 1:
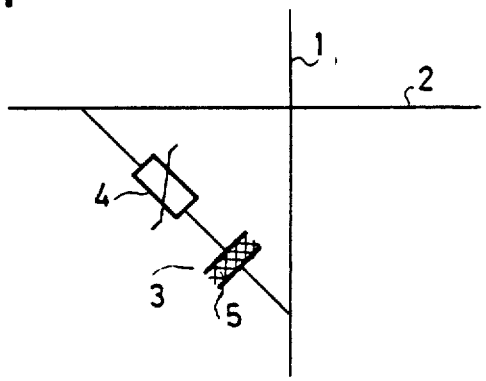
FIG. 1 diagrammatically an image element of a matrix access display screen.

FIG. 1 diagrammatically shows an image element of a display screen. The intersection of a column 1 and a row 2 defines the image element represented by a unit cell 3 symbolized by a capacitor, whose dielectric 5 is the electrooptical material. The unit cell 3 is associated with a non-linear element 4. A potential difference applied between column 1 and row 2 may or may not control the unit cell 3, as a function of the threshold voltage of the non-linear element.

Figure 2:
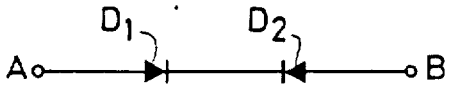
FIGS. 2 and 3 electrical diagrams.
Figure 3:
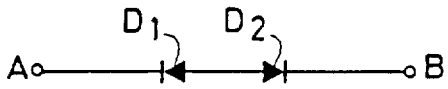
Figure 4:
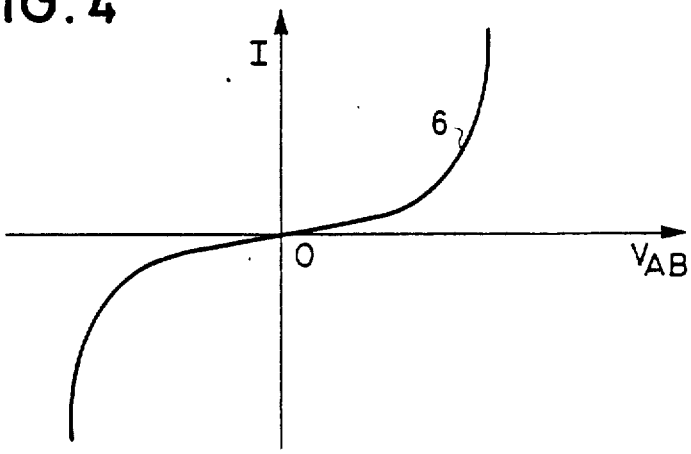
FIG. 4 an explanatory graph.

The non-linear element can be produced by the series—opposition association of two diodes $D_1$ and $D_2$. There are two possible arrangements for this dioides, as is shown by the electrical diagrams of FIGS. 2 and 3. FIG. 4 is a graph, whose curve 6 gives the path of the current I passing through non-linear element, as a function of the potential difference $V_{AB}$ applied to its terminals, i.e. between A and B. It can be seen that curve 6 is very non-linear. It is advantageous to use amorphous silicon Schottky diodes, which have highly non-linear inverse characteristics.

Figure 5:
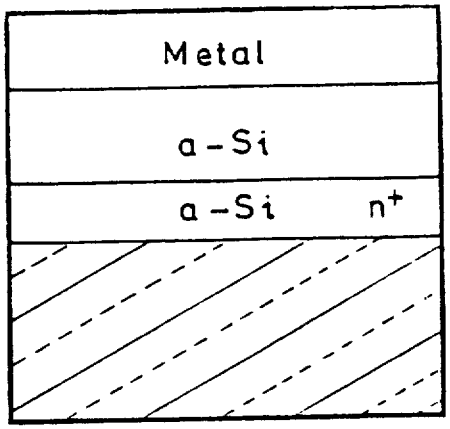
FIG. 5 a Schottky diode structure.

FIG. 5 illustrates an amorphous silicon Schottky diode structure. Typically, this type of diode is obtained by the deposition on a support 10 of a first amorphous silicon layer 11 having a type $n^+$ doping, a second undoped amorphous silicon layer 12 and a surface layer 13 formed from a metal which forms the Schottky junction with the underlying layer. Conventionally, the metal is platinum, but the choice can be extended to metals having identical properties, such as pallidium or gold, In order to ensure a good metal—semiconductor contact, the metal layer 13 can undergo a treatment, so as to form a platinum silicide interface.

A description will now be given of the process for producing a matrix access display screen. As a non-limitative example, it is a nematic liquid crystal screen. The support can be made from any material compatible with the temperature reached during the deposition of layers and which are typically approximately 600° C. In particular, it can be a quartz polycrystalline or crystalline silicon, or can be based on certain glasses able to withstand high temperatures.

Three successive amorphous silicon layers, which are respectively undoped, $n^+$ doped and undoped are deposited on the support. The deposition method used can be a gaseous phase method under atmospheric pressure and at 600° C., or a chemical vapour deposition (CVD) method. It consists of a thermal decomposition of silane $SiH_4$, which is the silicon source. The carrier gas used is hydrogen. A type n doping is carried out by introducing dilute phosphine $PH_3$ into the hydrogen.

Figure 6:
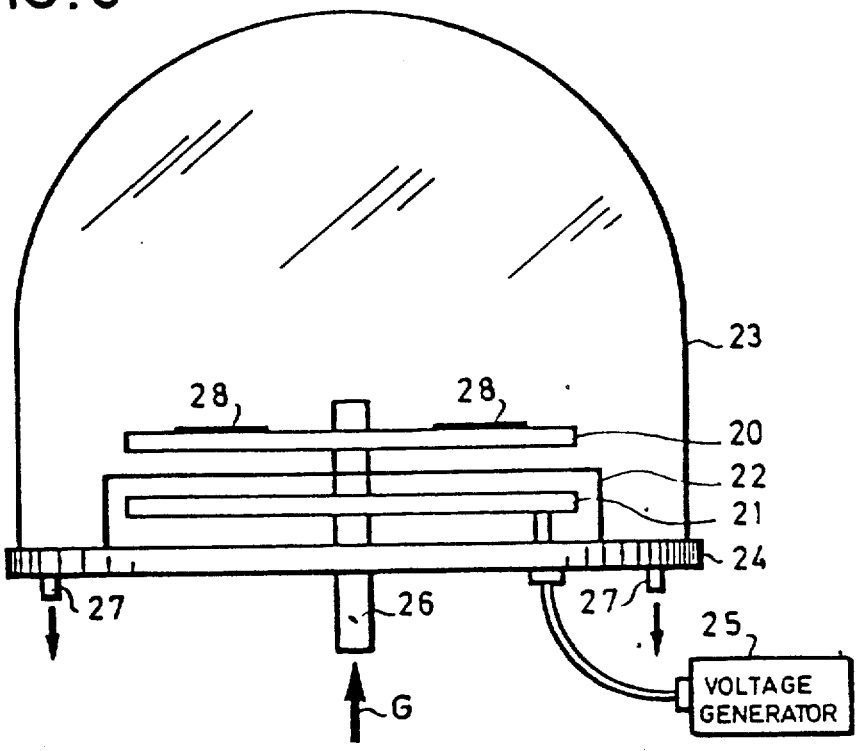
FIG. 6 an apparatus making it possible to produce amorphous silicon deposits.

Although the deposition method is known, it is well worth briefly describing an apparatus which permits this deposition and which is shown in FIG. 6. The latter diagrammatically shows a reactor incorporating a vertical reaction chamber and constituted by the following members:

- a circular graphite susceptor 20 covered with silicon carbide resting on a quartz pedestal (not shown in the drawing), the susceptor—pedestal assembly performing a rotary movement which can be typically set between 0 and 30 revolutions per minute;
- a coil incorporating a helical choke 21, located in a plane parallel to susceptor 20 and inductively coupled therewith, the choke being connected to a high frequency generator 25 operating at 400 kHz and with a power level of 25 kW;
- a quartz skirt 22 insulating the choke from the reaction chamber;
- a quartz bell-shaped member 23, resting on a quartz base 25, the assembly defining the volume of the reaction chamber;
- an injector 26 located in the centre of the susceptor permitting the introduction of the gases G to be decomposed into the reaction chamber, the gases being discharged from the bottom of the reactor through orifices 27.

The gaseous flow rates are measured in a conventional manner with the aid of ball flowmeter tubes provided with stainless steel blower valves. On susceptor 20 are shown with reference numeral 28 devices in the course of production, i.e. devices incorporating at least one support on which are deposited one or more layers according to the process of the invention. Ball-shaped member 23 can also be provided with observation windows making it possible to measure the temperature reached by devices 28 using infrared measuring devices. All these arrangements are known to the worker in the art. The injected gas G consists of hydrogen at atmospheric pressure, whose typical flow rate is approximately 32 liters/minute and a mixture of other gases, whose nature is dependent on the layer to be produced. The layer growth rate is approximately 1.5 micrometers/hour.

FIG. 7 is a view of a substrate with the different silicon layers. From bottom to top, it is possible to see a square or rectangular support layer 30 covered with three amorphous silicon layers, namely an undoped layer 31, a $n^+$ doped layer 32 and an undoped or very weakly doped layer 33. For example, the doping of layer 32 corresponds to a ratio $$\frac{PH_3}{SiH_4} = 10^{-3}$$

representing a conductivity of approximately $0.1\Omega^{-1}\cdot cm^{-1}$. The thickness of the deposited layers can vary between 1000 and a few thousand Angstroms.

The different layers can also be deposited by a low pressure chemical vapour deposition or LPCVD method. In this case, the deposits are made under a pressure of approximately 500 millitorrs and with a temperature of approximately 565° C.

In order that the substrate can have polycrystalline silicon transistors, the invention provides for the crystallization of the peripheral part of the previously deposited layers. This recrystallization is carried out in a furnace, whose temperature gradient has an abrupt profile permitting the rapid conversion of the crystallized areas while the remainder of the basic material is kept in the amorphous state. The annealing time and the temperature are controlled so as to crystallize at least up to the second deposited layer, which is $n^+$ doped. Crystallization takes place systematically by nucleation of the crystallites at the support layer—silicon interface, followed by a crystalline growth. At a temperature of approximately 600° C., an approximately 1 micrometer thick layer is entirely crystallized in a few hours. For a temperature equal to or below 570° C., the crystallization is not initiated during this period. This is due to the high dependence of the nucleation and crystallization speeds with the temperature. For these temperatures, the phosphorus diffusion coefficient is low and this treatment causes no problems of doping undoped layers.

FIG. 8 is a view of the substrate with its silicon layers following the crystallization stage. The same references as in FIG. 7 designate the same elements. Crystallization has taken place on those parts located to the left of axis AA' and to the right of axis BB'. The polycrytsalline silicon areas 34 and 35 are shown by hatched lines.

It can be seen that at least the first two layers have been affected by the crystallization.

FIG. 9 is a sectional view of the temperature gradient furnace used during the crystallization stage. The substrate incorporating its silicon layers is represented by the device 60 placed on a support 61 integral with a shaft 62. An e.g. quartz enclosure 63 insulates device 60. Enclosure 63 has openings 64, 65, and supports two groups of heating turns or coils 66, 67. The group of coils 67 is placed to the left of the aforementioned axis AA', and the group of coils 66 is placed to the right of axis BB'. Openings 64 and 65 are used for placing the enclosure 63 under vacuum or under an argon atmosphere. The heating induced by coils 66, 67 brings about the crystallization of the areas of device 60 placed in the centre of said coils. The distance separating the coils from device 60 is adjusted so as to aid an abrupt profile in the distribution of the temperature to which it is raised. The temperature of the areas located to the left of axis AA' and to the right of axis BB' is maintained such that it permits crystallization. However, This temperature is not so high that the volume of the substrate between axes AA' and BB' is converted from the amorphous to the crystalline state. This leads to a device having crystallized areas along two of its sides. In order to crystallize the areas located along the two other sides, it is merely necessary by means of shaft 62 to rotate the device by 90°.

The amorphous silicon samples obtained by CVD at 600° C. have an important broken bond density. The electronic states corresponding to a broken bond are deep in the forbidden band and makes the material semiinsulating. By heat treatment in an atomic hydrogan environment, it is possible to chemically passivate the broken bonds by the formation of Si—H bonds. This post-hydrogenation is performed at a temperature of approximately 400° C. in a plasma of hydrogen generated by microwaves.

Figure 10:
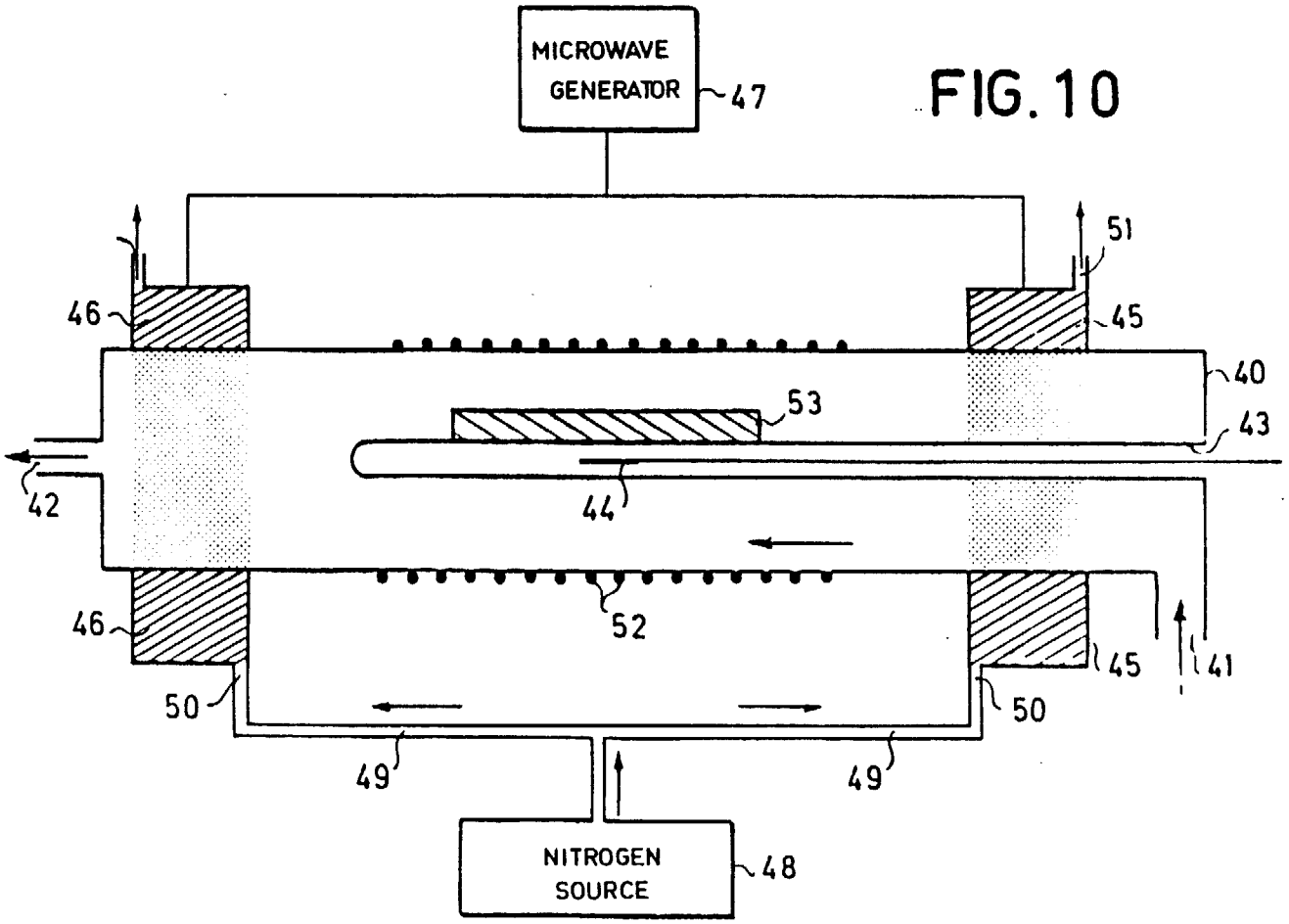
FIG. 10 a sectional view of a post-hydrogenation apparatus.

FIG. 10 is a sectional view of an apparatus used in preferred manner for this phase of the process consisting of the heat treatment of the device in an atmosphere containing atomic hydrogen. A cylindrical quartz body 40 within which is placed in the device 53 to be treated has an inlet 41 making it possible to introduce molecular hydrogen and an outlet 42 firstly used for producing the vacuum and then for ensuring a very limited circulation of the gases during the treatment. A central cavity 43, located in the axis of the cylindrical body, makes it possible to measure the temperature of the device with the aid of a thermocouple 44 without any sealing problems. Cavity resonators 45, 46 excited by a microwave generator 47 convert the molecular hydrogen into atomic hydrogen by ionization. A typical value of the power absorbed by each cavity resonator is 50 W and the operating frequency, corresponding e.g. to one of the frequencies standardized by the regulations in force in France, is 2.45 GHz. The unused consumed power appearing in its calorific form is removed by nitrogen circulation through the cavity resonators. A nitrogen source 48 is connected by pipes 49 to inlets 50 placed in the cavity resonators 45, 46. Outlets 51 on the cavity resonators and diametrically opposite to inlets 50 enable the nitrogen to escape to the outside.

Approximately 30 non-contiguous turns or coils 52 are wound on to the quartz cylinder and are distributed over a length of approximately 15 cm. By radiation and convection, they ensure the temperature rise of the device 53. Device 53 to be treated is outside the ionized regions positioned within cavity resonators 45, 46. Therefore, the gaseous mixture circulating in the vicinity of the substrate contains no ions or electrons able to produce etching by bombardment of the substrate. According to another important feature of this type of apparatus, two atomic hydrogen sources obtained by cavity resonators 45 and 46 are positioned on either side of the substrate being treated. This arrangement leads to a more homogeneous distribution of the atomic hydrogen in contact with the substrate.

At the end of this operation, materials post-hydrogenated on the surface and in the thickness are obtained, in accordance with a profile depending on the duration and the temperature of the operation.

The following stage consists of etching the peripheral areas of the device, so as to produce at these locations matrix screen control transistors. Etching can be carried out chemically or by plasma. In order to produce a transistor of the MOSFET type, it is possible to use the layer $n^{30}$ for forming the source and drain ohmic contacts by conventional photolithography methods. An oxide ($SiO_2$) or a nitride ($Si_3N_4$) deposited at low temperature by electroluminescent discharge makes it possible to complete the transistor. The source and drain contacts are produced by etching the oxide or nitride insulating layer and by aluminum vaporization deposition. The gate contact can be deposited by the same method.

Figure 11:
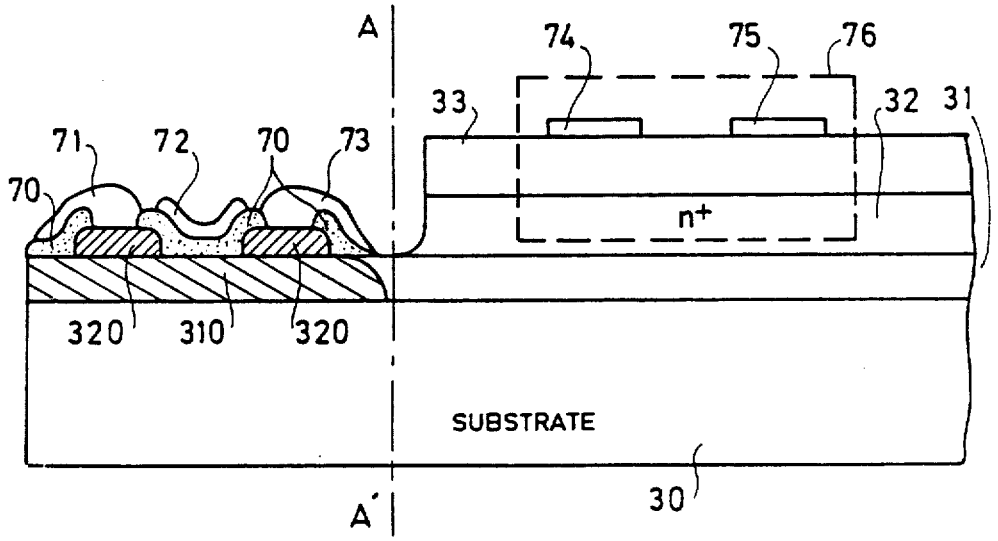
FIG. 11 a part sectional view of a substrate for a display screen.

FIG. 11 is a part sectional view of a substrate for a display screen having two elements ensuring the matrix control, namely a non-linear element produced by placing two Schottky diodes in series opposition and a row or column control MOSFET. It is possible to see support 30 covered on one side of axis AA' with three amorphous silicon layers 31, 32 and 33, layer 32 being $n^+$ doped whilst on the other side of axis AA' there is an undoped polycrystalline silicon layer 310 and $n^+$ doped polycrystalline silicon areas 320. The insulating layer covering layers 310 and 320 carries reference numeral 70. Contacts 71, 72 and 73 are respectively the source, gate and drain contacts. Platinum contacts studs 74, 75 are deposited on layer 33 in order to obtain Schottky diodes. The dotted line 76 defines a non-linear element constituted by the series—opposition arrangement of two diodes. Thus, contact studs 74, 75 form the two non-linear element terminals.

Figure 12:
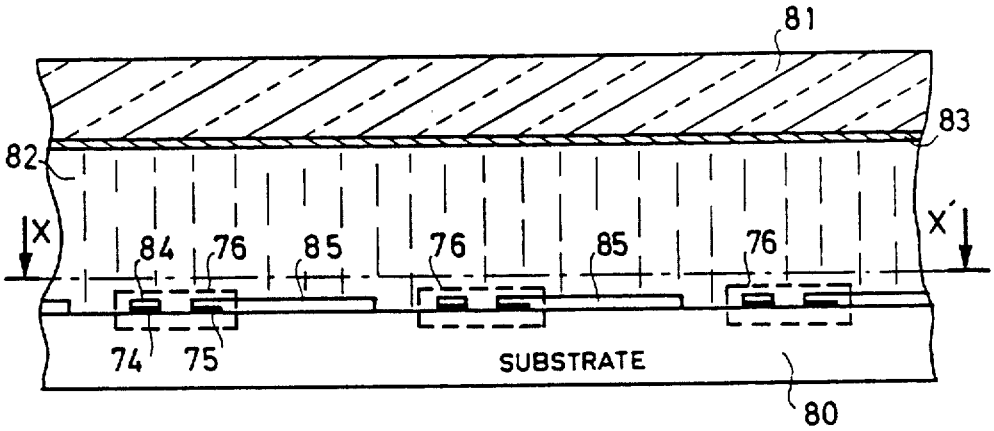
FIGS. 12 and 13 views of a matrix access display screen.
Figure 13:
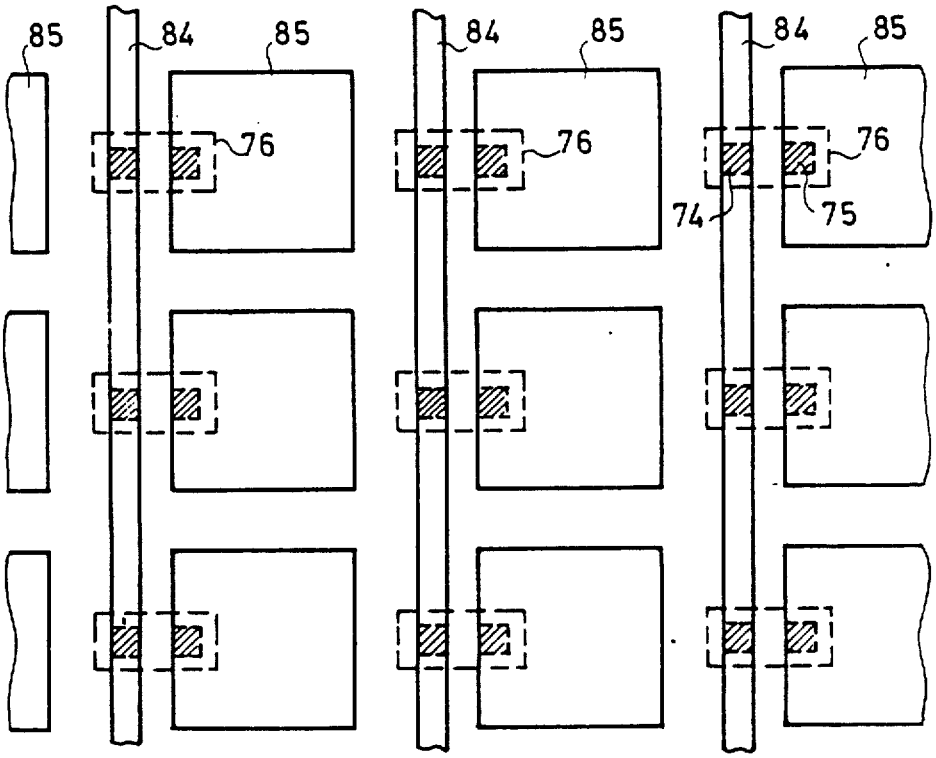

FIG. 12 is a sectional view of a matrix access screen according to the invention and FIG. 13 is a plan view of the same screen along axis XX'.

In FIG. 12 it is possible to see a substrate 80 formed from a support layer and silicon layers covering the same and which integrate the non-linear elements. This drawing does not show the peripheral areas of the substrate having the control transistors. As stated hereinbefore contact studs 74, 75 form the terminals of the non-linear elements. A second layer 81 is positioned in front of support 80 at a distance of about a dozen micrometers and defined by not shown shims. The space between layer 81 and substrate 80 is occupied by an electrooptical material 82, e.g. a liquid crystal having a nematic phase. For example, layer 81 supports the row connections of the matrix system. These connections are constituted by conductive, transparent strips 83, e.g. made from a mixed tin—indium oxide. The non-linear elements 76 are arranged in columns in the manner shown in FIG. 13. Column connections constituted by thin conductive strips 84 make it possible to have access to the non-linear elements of the same column by the overlapping of contact studs 74. Second contact studs 75 of the non-linear elements are in contact with electrodes 85. Each electrode 85 defines, by the contour of its surface which is approximately 1 $mm^2$, an image element. The row connections 83 are roughly of the same width as electrodes 85 and face the latter.

A control voltage supplied to an image element by means of MOS transistors integrated into the periphery of the substrate is consequently applied to the series dipole constituted by a non-linear element and a unit cell of liquid crystal in the manner described relative to FIG. 1. Due to the very limited length of the column connection 84, account has not been taken of the electrooptical effect which could occur between connections 83 and 84. Connections 84 can also be covered with an insulating layer. A the reading of the screen takes place by reflection, it is necessary for layer 81 to be transparent, in the same way as conductors 83. Electrodes 85 are reflecting and are e.g. made from aluminium. The deposition of the various conductors 83, 84 and 85 causes no particular problem. The connections between the MOS transistors of the periphery of the screen and the row and column connections on the one hand and the circuits outside the screen on the other are brought about by a conventional connection procedure.

In order to use the screen in transmission, it is merely necessary to remove by chemical etching the amorphous silicon layers located between the non-linear elements.

In an embodiment, the active elements associated with the image elements could be thin film transistors, as for the active control elements. They can be produced from a single peripherally crystallized, undoped, amorphous silicon layer. A transistor is produced by depositing aluminium studs on the silicon layer, in order to form the drain and the source covered with an insulating layer and this is finally followed by the gate stud.

The present invention combines the advantages of integrated addressing based on amorphous silicon diodes, which is easily obtained without any critical overlap problems, and an integrated control based on polycrystalline thin film transistors supplying the necessary conditions for the control of the matrix screen.

The invention is not limited to the production of a substrate for a display screen. For example, it can be used for producing integrated circuits requiring substrates incorporating amorphous silicon elements bordering the polycrystalline silicon elements.

What is claimed is:

1. A process for producing a silicon substrate useful for the incorporation therein of transistors and diodes comprising the steps of positioning an amorphous silicon substrate in a furnace which has a non-uniform temperature distribution such that edge regions of the substrate are in a zone at a temperature high enough to convert the amorphous silicon to the polycrystalline form while the interior regions of the substrate are in a zone at a temperature insufficiently high to crystallize the amorphous silicon, and removing the substrate from the furnace after desired edge regions of the substrate have been crystallized.

2. The process of claim 1 followed by the forming of thin-film transistors in the polycrystalline edge regions of the substrate and of nonlinear diodes in the amorphous interior region.

3. The process of claim 1 in which the amorphous silicon substrate comprises in succession a relatively lightly doped first layer, a relatively heavily draped second layer, and a relatively lightly doped third layer, each formed by the thermal decomposition of silane.

4. The process of claim 3 in which the amorphouse silicon substrate had earlier been exposed to a hydrogen plasma for post-hydrogenation of the amorphous silicon formed by the thermal decomposition of silane.

5. A process for making a matrix access display screen having image elements at intersections of row and column access electrodes including forming a substrate in accordance with claim 1, forming in the amorphous regions a plurality of oppositedly poled diode pairs and in the polycrystalline regions a plurality of thin filrm transistors, incorporating the transistors into circuitry with the row and column electrodes of the display screen and incorporating the diode pairs in series with electrooptical image elements of the display screen.

*6. A display screen of the matrix access type incorporating an electro-optical material layer inserted between a transparent layer and a silicon substrate comprising:*

*first active elements in a region of the silicon substrate consisting of amorphous silicon, said first active elements being in series with the image elements of the display screen, and*

*second active elements in a region of the silicon substrate that were initially amorphous but were transformed by annealing to polycrystalline silicon, said second active elements being used to address the matrix access display screen.*

*7. The display screen of claim 6 in which the region of the silicon substrate transformed to polycrystalline silicon is situated in the periphery of the substrate.*

*8. The display screen of claim 7 in which the first active elements consist of oppositely pole diodes pairs and the second active elements consist of thin film transistors.*

* * * * *